(12) United States Patent
Giorgi et al.

(10) Patent No.: US 7,868,352 B2
(45) Date of Patent: Jan. 11, 2011

(54) SILICON BREAK OVER DIODE

(75) Inventors: David M. Giorgi, Solana Beach, CA (US); Tajchai Navapanich, San Diego, CA (US)

(73) Assignee: OptiSwitch Technology Corporation, San Diego, CA (US)

( * ) Notice: Subject to any disclaimer, the term of this patent is extended or adjusted under 35 U.S.C. 154(b) by 158 days.

(21) Appl. No.: 12/284,717

(22) Filed: Sep. 23, 2008

(65) Prior Publication Data

US 2010/0072512 A1    Mar. 25, 2010

(51) Int. Cl.
*H01L 27/02* (2006.01)
*H01L 29/87* (2006.01)
(52) U.S. Cl. ............... 257/109; 257/111; 257/E29.337; 438/421
(58) Field of Classification Search .................. 257/109, 257/118, 121, 496, E29.337, E29.023, 111, 257/112, 122; 435/165, 161; 438/139, 421, 438/798

See application file for complete search history.

(56) References Cited

U.S. PATENT DOCUMENTS

| 4,076,555 | A | | 2/1978 | Chu et al. | |
|---|---|---|---|---|---|
| 4,080,620 | A | | 3/1978 | Chu | |
| 4,224,083 | A | * | 9/1980 | Cresswell | 438/134 |
| 4,974,050 | A | * | 11/1990 | Fuchs | 257/496 |

OTHER PUBLICATIONS

C.K. Chu, R.R. Shaw, J.E. Johnson, J.B. Brewster, 1000 Volt and 800 AMP Peak Reverse Switching Rectifier, IEEE Industry Application Society, 1976, pp. 267-282.

IXYS Corporation, Breakover Diodes: Applications, 2000, 8 pages.
Brewster et al., Complete Characterization Studies Provide Verification of RBDT (RSR) Reliability, IEEE Transactions on Electronic Devices, vol. ED-26, No. 10, Oct. 1979, pp. 1462-1468.
Chu et al., 1200 V and 5000 A Peak Reverse Blocking Diode Thyristor, Japanese Journal of Applied Physics, vol. 16, 1997, pp. 537-540.
Gardenghi, A Super Power RSR, Westinghouse Electronic Corporation, 1997, pp. 367-369.
Hooper et al., An All Solid-State Modulator for the ARSR-3 Transmitter, IEEE Transactions on Electron Devices, vol. ED-26, No. 10, Oct. 1979, pp. 1496-1499.

* cited by examiner

*Primary Examiner*—Thomas L Dickey
*Assistant Examiner*—Nikolay Yushin
(74) *Attorney, Agent, or Firm*—David H. Carroll

(57) ABSTRACT

A Break Over Diode ("BOD") device is a gate-less two terminal high power semiconductor switch in which transitions from a blocking state to a conducting state are triggered by a dV/dt pulse to the anode. The BOD device can be thought of as two cross-coupled PNP and NPN transistors, and includes both anode and cathode shorts which reduce the gain of the NPN and PNP transistors by shunting some current away from their bases directly to their emitters, thereby improving blocking. Moreover, the anode and cathode shorts in conjunction with the device blocking junction form PN diodes which are distributed throughout the bulk of the material and function as anti-parallel diodes to the base-emitter junctions of the PNP and NPN transistors, which enables the BOD device to handle a larger current reversal for a longer period of time. The P base layer may be made thin to decrease the voltage fall time from full blocking to full conduction, and the cathode and anode shorts may be provided in a honeycomb pattern.

10 Claims, 3 Drawing Sheets

SILICON BREAK OVER DIODE

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Prime Contract Number DTRA01-01-P-0168 awarded by the Defense Threat Reduction Agency, and as provided for by the terms of Subcontract Number 4400149240 to Prime Contract Number WHZV56-05-C-0225 WD AJ awarded by the US Army Tank Automotive Command.

BACKGROUND OF THE INVENTION

1. Field of the Invention

The present invention relates to fast electrical switching of high voltage circuits, and more particularly to silicon break over diode for such applications as pulse power switching and circuit protection.

2. Description of Related Art

The function of fast electrical switching of high voltage circuits is being done with various different types of semiconductor devices, including thyristors such as the gate turn-off thyristor ("GTO"), the super gate turn-off thyristor ("SGTO"), the light activated semiconductor switch ("LASS"), and the light triggered thyristor ("LTT"); insulated gate bipolar transistors ("IGBT's"); metal oxide semiconductor field effect transistors ("MOSFET's"), and a type of Russian device known as the dynistor.

Many of these devices have gates to control the functioning of the device. The gate turn-off thyristor, for example, has a gate electrode that is used along with anode shorts to control the turn-off of the device. However, the presence of additional terminals on a device increases the complexity of the control circuits for the device. In addition, the gate areas decrease the device active area, thereby reducing the current carrying ability of the device.

A type of device known as a break over diode ("BOD"), which is also known by the names reverse blocking diode thyristor ("RBDT") and reverse switching rectifier ("RSR"), is a two-terminal thyristor having only an anode and a cathode. Advantageously, the device lacks a gate electrode. The RBDT, which has shorts to the cathode-base region, is capable of being switched from a high impedence "off" state to a low impedence "on" state in a very short period of time. RBDT's are disclosed in many publications, including Chang K. Chu et al, IEEE Industry Application Society, 1973, pages 267-82, and U.S. Pat. No. 4,076,555 issued Feb. 28, 1978 to Chang K. Chu et al. and entitled "Irradiation for Rapid Turn-Off Reverse Blocking Diode Thyristor."

U.S. Pat. No. 4,080,620 issued Mar. 21, 1978 to Chang K. Chu and entitled "Reverse Switching Rectifier and Method for Making Same" discloses a reverse switching rectifier in which a PNPN semiconductor structure has an N-type end zone or cathode-emitter zone that penetrates to two different levels in the semiconductor body, namely a deep central portion and a shallow peripheral portion. The exposed surfaces of the N-type end zone are then metallized to provide electrical and thermal contact thereto. The patent further discloses a shunt pattern in the surface after the N-type diffusion of zones, in which each shunt has four nearest neighbors, a preferred center-center separation distance S being 20 mils, and a preferred diameter D being 5 mils. According to the patent, satisfactory results may be achieved with S in the range from about 10 to about 35 mils and D in the range from about 3 to about 11 mils, with larger diameters requiring a corresponding larger separation distance.

While RBDT's are used in various applications, they are not entirely well suited to very high power applications in excess of about 1.2 kV and 5 kA per part, or large current reversals for sustained periods of time. Moreover, they do not operate at close to theoretical blocking voltage.

SUMMARY OF THE INVENTION

In one or more embodiments, the present invention is a large area (illustratively greater than about 1 cm$^2$) gate-less break over diode that has four semiconductor layers (p/n/p/n) with both anode and cathode shorts that create distributed anti-parallel diodes. Such embodiments are capable of supporting a high rate of rise of current (dI/dt), operating at close to theoretical blocking voltage, and/or handling a larger current reversal for a longer time. In a variation of this embodiment, hexagonal shorting patterns are advantageously used for more uniform current flow. In another variation of this embodiment, the P base of the cathode transistor may be made thin to improve the switching speed from full blocking to full conduction.

One or more of the embodiments of the present invention are particularly suitable as pulsed power switches for the commercial pulsed power community and the US and foreign military and energy generation industries, including biofuels and nuclear. One or more embodiments of the present invention are also particularly suitable for surge protection when two units are placed anti-parallel such as in, for example, a bi-directional lighting arrestor.

One embodiment of the present invention is a two-terminal semiconductor switching device comprising: a P+ layer of semiconductor material having first and second major surfaces; a plurality of N+ regions distributed in the P+ layer and passing through the P+ layer between the first and second major surfaces thereof; a metallization layer disposed on the first surface of the P+ layer and on a surface portion of each of the N+ regions; a N− layer of semiconductor material having first and second major surfaces, the first major surface of the N− layer being disposed proximate the second major surface of the P+ layer; a P layer of semiconductor material having first and second major surfaces, the first major surface of the P layer being disposed contiguous to the second major surface of the N− layer to form a blocking junction; a N+ layer of semiconductor material having first and second major surfaces, the first major surface of the N+ layer being disposed proximate the second major surface of the P layer; a plurality of P+ regions distributed in the N+ layer and passing through the N+ layer between the first and second major surfaces thereof; and a metallization layer disposed on the second surface of the N+ layer and on a surface portion of each of the P+ regions.

In one variation of this embodiment, the N+ regions are distributed uniformly in the P+ layer in a hexagonal arrangement about centrally disposed members, and the P+ regions are distributed uniformly in the N+ layer in a hexagonal arrangement about centrally disposed members, with the P+ regions and the N+ regions being aligned with one another.

In another variation of this embodiment, the P layer of semiconductor material is made thin for improving device switching speed from full blocking to full conduction.

In a further variation of this embodiment, the semiconductor switching device further comprises a N layer of semiconductor material disposed between the P+ layer and the N− layer for providing a field stop.

DETAILED DESCRIPTION OF THE INVENTION, INCLUDING THE BEST MODE

The Break Over Diode ("BOD") device described herein in various implementations is a gate-less two terminal high power semiconductor switch in which transitions from a blocking state to a conducting state are triggered by a dV/dt pulse to the anode. Once a forward current greater than a "holding current" begins to flow, the device latches ON like a normal gated thyristor, and the switch does not open until the forward current is reduced by external means well known to those of ordinary skill in the art to below the holding current. Switch closing is achieved by a dV/dt pulse at the anode which results in one or more of the following: avalanche generation at the blocking PN junction, forward biasing of the top and bottom emitter junctions due to flow of a displacement current, or punch-through of the depletion region to the anode in which the electrical field from the dV/dt pulse expands the depletion region close enough into the P+ anode region such that holes are injected from the anode side of the device.

Figure 1:
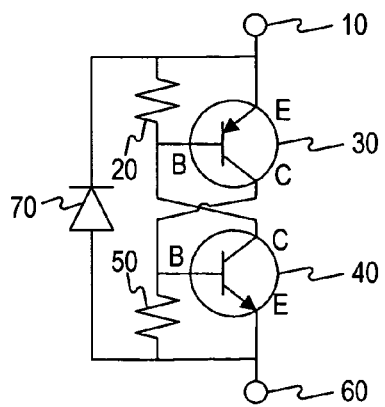
FIG. 1 is a schematic diagram of an equivalent circuit for a break over diode having anode and cathode shorts.

FIG. 1 shows a BOD device equivalent circuit having two interconnected transistors, a PNP transistor 30 which may be thought of as an anode transistor, and an NPN transistor 40 which may be thought of as a cathode transistor. The emitter of the anode PNP transistor 30 functions as the BOD device anode 10, the emitter of the cathode NPN transistor 40 functions as the BOD device cathode 60, the collector of the anode PNP transistor 30 is connected to the base of the cathode NPN transistor 40, and the collector of the cathode NPN transistor 40 is connected to the base of the anode PNP transistor 30. The anode shorts are collectively represented by anode short resistor 20 connected between the base and emitter of the anode PNP transistor 30, and the cathode shorts are collectively represented by cathode short resistor 50 connected between the emitter and base of the cathode NPN transistor 40. The anode and cathode shorts in combination with various regions of the device form distributed anti-parallel diodes collectively represented by the anti-parallel diode 70 connected between the emitter of the cathode NPN transistor 40 and the emitter of the anode PNP transistor 30.

The BOD device of FIG. 1 is capable of handling not only forward current, that is, current in the forward blocking direction that is greater than a "holding current," but can also handle a reverse current flow from the cathode 60 out to the anode 10 through the distributed anti-parallel diode 70. Advantageously, the distributed anti-parallel diode 70 enables the BOD device to handle a larger current reversal for a longer period of time than a BOD device having cathode shorts alone. The ability to conduct larger currents is particularly advantageous for pulsed power applications where load faults can cause severe current reversal.

Figure 2:
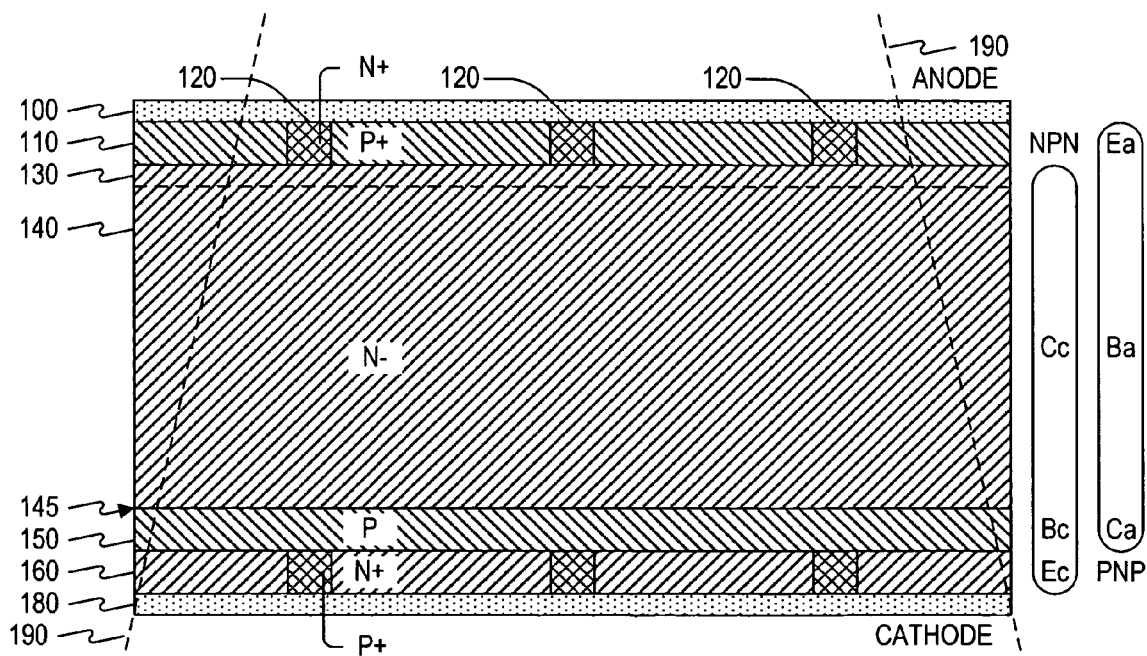
FIG. 2 is a cross-sectional view of one implementation of a break over diode device having anode and cathode shorts.

FIG. 2 shows an illustrative implementation of a BOD device having a single large area, illustratively greater than 1 $cm^2$, made of four alternating semiconductor layers, namely: a P+ layer 110 that functions as the anode emitter, a N− substrate layer 140 that functions as the anode base and also as the cathode collector, a P layer 150 that functions as the anode collector and also as the cathode base, and a N+ layer 160 that functions as the cathode emitter. A blocking junction 145 for blocking in the forward direction is formed between the layer 140 and the layer 150. An optional N buffer layer 130, shown in phantom, may be fabricated between the P+ layer 110 and the N− layer 140 to act as a field stop. In this manner, a higher background resistivity material can be used to support a larger average electric field, with the result that the same thickness part can handle nearly twice the voltage. However, care should be taken to avoid inhibiting uniform current flow through the device due to the addition of the N buffer layer 130. An anode electrode 100 is provided over the P+ layer 110, the anode emitter; and a cathode electrode 180 is provided over the N+ layer 160, the cathode emitter. At the device edges, bevels 190, shown in phantom, may be provided if desired. Since the BOD of FIG. 2 performs forward blocking but does not block in the reverse direction, the bevel may be a positive bevel (anode area smaller than cathode area) of any desired angle, preferably in the range of from about thirty degrees to about seventy degrees.

The N+ emitter of the cathode NPN transistor, layer 160, is electrically shorted to the P base of the cathode NPN transistor, layer 150, by the cathode electrode 180 in combination with so-called cathode shorts, which are P+ areas 170. Similarly, the N− base of the anode PNP transistor, layer 140, is electrically shorted to the emitter of the anode PNP transistor, layer 110, by the anode electrode 100 in combination with so-called anode shorts, which are N+ areas 120. Therefore, reverse current flows from the cathode electrode 180 to the anode electrode 100 through the numerous cathode shorts 170, the blocking junction 145, and other regions of the device.

Figure 3:
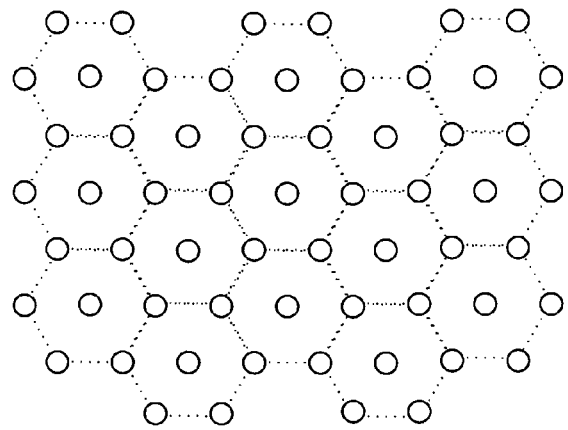
FIG. 3 is a plan view of a pattern of cathode shorts over a partial area of a break over diode device.

FIG. 3 shows an illustrative layout of part of the cathode area of a BOD device in which the white circles represent the cathode shorts. The cathode shorts in the figure are arranged in a hexagonal or honeycomb shaped array having a central located short, rather than in a regular grid array. The centrally located short provides equidistance between all of the shorts in the array. Illustratively, the cathode shorts are about 0.1 mm in diameter and each nearest neighbor or unit cell is about 1 mm apart. The anode shorts may be dimensioned, spaced apart, and arranged in a manner identical to the cathode shorts and directly aligned with respect to them, although the anode shorts may be staggered with respect to the cathode shorts or even unaligned. The center-to-center spacing of the cathode and anode shorts may be designed to achieve a desired latch current, since the center-to-center spacing determines the resistance from metal to the base. A smaller pitch, for example, increases resistance so that a higher current is needed to latch.

The percentage of anode and cathode short area is a design parameter which determines the level of reverse current that the device can withstand. This percentage should be between eight and twelve percent, as it reduces the available active area of the device.

The device of FIG. 2 operates as follows in the forward blocking direction. A DC voltage may be placed across the device of FIG. 2 without triggering it, due to the presence of the blocking junction 145. To trigger the device, a dV/dt pulse is applied to the anode electrode 100 so that the anode electrode 100 pulses positive relative to the cathode electrode 180. The dV/dt pulse causes a current to flow through the device despite the presence of the blocking junction 145, which turns the device ON. The current is composed of a displacement current, avalanche current, punch-through current, or any combination thereof.

Having both anode and cathode shorts has numerous advantageous. The anode and cathode shorts essentially reduce the gain of the transistors, reducing the amplification of thermally generated carriers. This effectively results in a lower overall leakage current making the device less sensitive to leakage current and allowing the device to operate near theoretical limits.

Another advantage is that the anode and cathode shorts in conjunction with P layer 150 and N− layer 140 form PN diodes which are distributed throughout the bulk of the material and function as anti-parallel diodes to the base-emitter junctions of the PNP and NPN transistors of the BOD device. Approximately 10% of the device surface area is occupied by these anti-parallel diodes. Advantageously, these anti-parallel diodes can handle reverse current flow, which enables the BOD device to handle a larger current reversal for a longer period of time than a BOD device having cathode shorts alone.

Advantageously, the P layer 150 which functions as the base of the cathode transistor may be implemented as a thin region of illustratively about 20 μm thickness and illustratively having a peak carrier concentration of less than about $10^{17}$ cm$^{-3}$. A thin $P_{base}$ in the NPN transistor 40 (FIG. 1) decreases the voltage fall time from full blocking to full conduction. However, care should be taken to ensure that the thin $P_{base}$ is uniform across the entire wafer for the device to block voltage. These characteristics may be achieved with a double ion implant process of either boron or aluminum. Double ion implantation, with a particle cleaning step in between, ensures that the particles on the surface of the wafer do not cause a void in the ion implantation. Be removing or moving any particles in the cleaning step, the second ion implantation will ensure complete coverage across the wafer leading to higher device yields.

BOD devices fabricated in accordance with the teachings herein are suitable for operation in high power applications, illustratively about 4 kV and 10 kA or greater. Higher dV/dt's of about 20 kV/μs or more are also suitable for triggering. Four devices having both anode and cathode shorts in a hexagonal pattern and a thin P base and similar to the device of FIG. 2 were stacked and tested, with a demonstrated result of 12 kV and 166 kA for a full-wafer (metal 81.8 mm, outer diameter 88 mm) with a current pulse rise time of 19 microseconds, Action of 4 MA$^{2-}$Seconds, and a pulse width of 168 microseconds.

In summary, the electrical structure of both anode and cathode shorts allows for a higher voltage blocking device than just cathode shorts alone. Higher voltage blocking means a higher power switch. Moreover, a reverse current capacity is provided by the anode and cathode shorts. Moreover, the thin $P_{base}$ results in a much faster switch npn transistor which speeds up the voltage collapse of the BOD device.

Various process steps may be used to fabricate the BOD device structure shown in FIG. 2. The BOD device structure may be made by diffusion, epitaxy, wafer bonding or any combination thereof. For example, the device can be made by first diffusing a $P_{base}$ region into an n substrate and then on top of this adding a patterned n+ region. On the other side of the device a patterned p+ region is formed. The n and p doping can be done with a combination of ion implantation or diffusion from both a solid or liquid source. Common implanted and diffused species for forming a p layer are Boron, Aluminum, Gallium or Indium. For forming an n layer Phosphorus, Arsenic or Antimony can be used. In addition to diffusion the device could be made with doped epitaxial layers or some method of wafer bonding doped layers can be employed. In principle, the device could be made by any combination of the above methods. If an $N_{buffer}$ is used this layer is typically done before the $P_{base}$(p+/$N_{buffer}$/n/$P_{base}$/n+). Suitable back end process include fabricating the bevel angles designed to decrease the electric field at the surface of the device to prevent breakdown at the edges. In addition, other termination techniques such as field rings or junction termination extensions may be used to eliminate the field on the edge from top to bottom and thereby prevent premature breakdown at the edges. Lastly the top metal could be any metal or series of metals that is commonly used to make ohmic contact to semiconductors. It could also be a silicide.

Silicon Carbide ("SiC") may also be used for the BOD device because it is capable of higher voltages, higher currents and higher temperatures than is Silicon.

Figure 4:
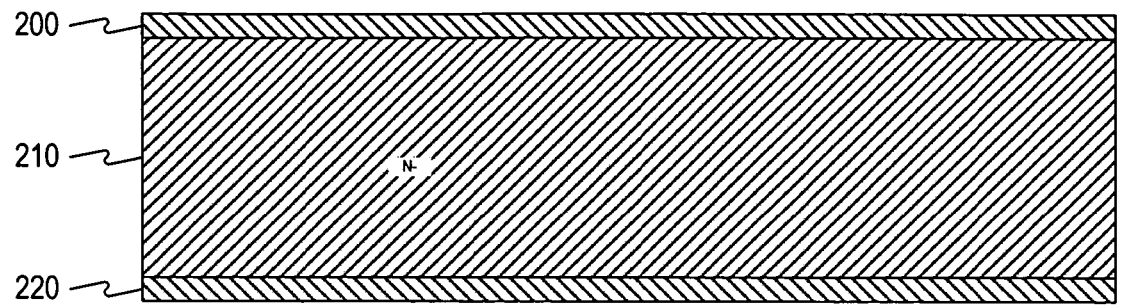
FIG. 4 is a cross-sectional view of a break over diode after the alignment targets and screen oxide steps of an illustrative fabrication process.

FIGS. 4-9 show an illustrative fabrication process for the BOD device of FIG. 2. The scribed and nonscribed sides of a silicon wafer 210 are prepared by coating with photoresist for definition of alignment targets. Next, the photoresist is removed and screen oxide layers 200 and 220 are grown to a thickness of 200 Angstroms (FIG. 4).

Figure 5:
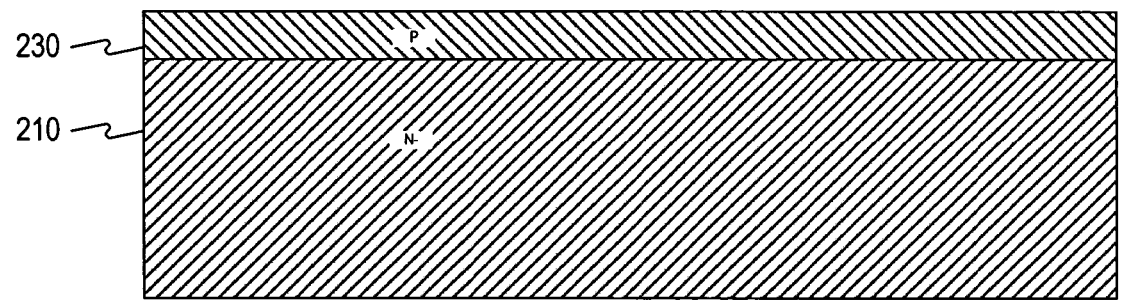
FIG. 5 is a cross-sectional view of a break over diode after the P-base implant and drive steps of an illustrative fabrication process.

Next, an BOD base boron implant is made into the nonscribed side at a dose of 2.25E15 and an energy of 60 keV, followed by cleaning and another BOD base boron implant at a dose of 2.25E15 and an energy of 60 keV. Next, the oxide layers are stripped in 6:1 BOE, the wafer is further cleaned, and a high temperature BOD base implant drive is performed, resulting in P base 230 (FIG. 5).

Figure 6:
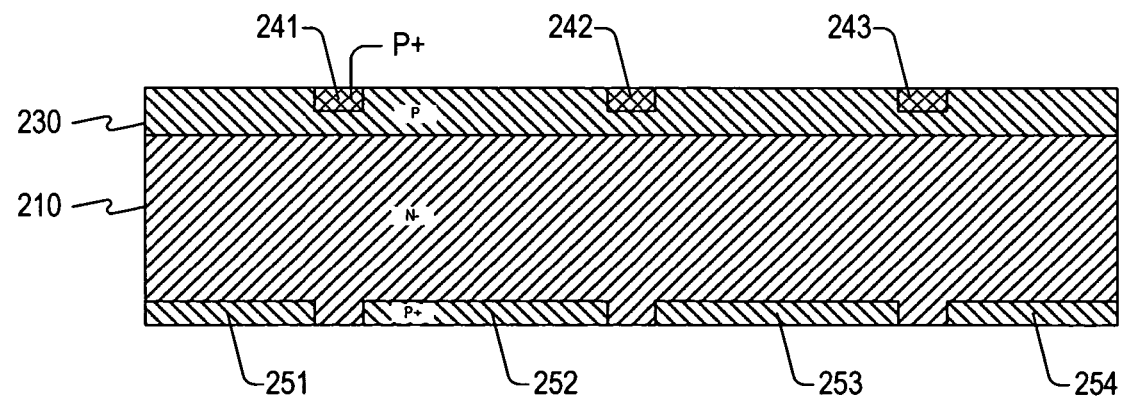
FIG. 6 is a cross-sectional view of a break over diode after the P+ emitter and cathode shorts steps of an illustrative fabrication process.
Figure 7:
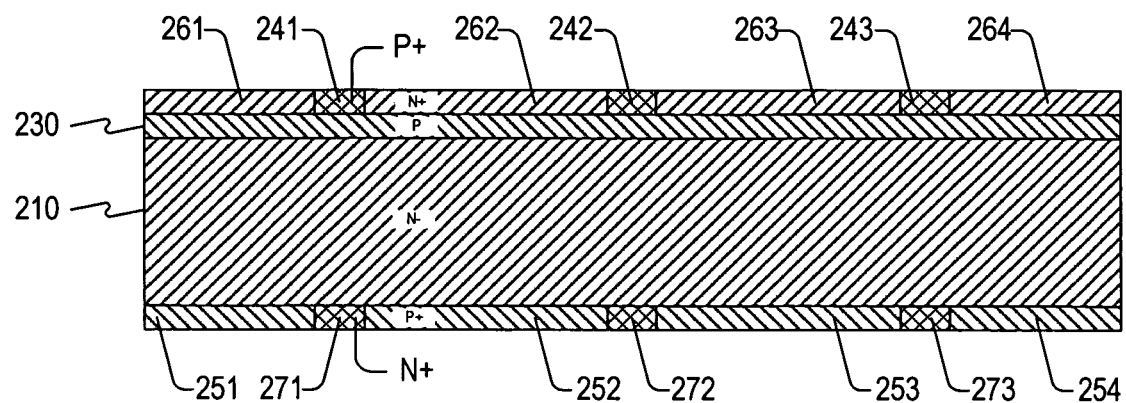
FIG. 7 is a cross-sectional view of a break over diode after the N+ emitter and anode shorts steps of an illustrative fabrication process.

Next, the nonscribed and scribed sides are coated with photoresist. The nonscribed side is patterned with the cathode short pattern and the scribed side is patterned with the P+emitter pattern. Next, BBr3 is deposited followed by an anneal and reoxidation step. Next, the nonscribed and scribed sides are again coated with photoresist, the nonscribed side is again patterned with the cathode short pattern, and the scribed side is again patterned with the P+ emitter pattern. POCl3 is deposited into the emitter by diffusion, an BOD POCl3 drive step is performed, and a post POCl3/BBr3 anneal and reoxidation step is performed. The resulting structure has P+ cathode shorts 241, 242 and 243 defined in the P base 230, and P+ emitters 251, 252 and 253 defined in the N− silicon 210 (FIG. 6).

Next, the nonscribed and scribed sides are coated with photoresist. The nonscribed side is patterned with the N+ emitter pattern and a POCl3 getter diffusion step is performed. The resulting structure has N+ anode shorts 271, 272 and 273 defined in the N− silicon 210, and N+ emitters 261, 262 and 263 defined in the P base layer 230. The nonscribed side is patterned with the N+ cathode emitter pattern and the scribed side is patterned with the anode short pattern. A POCl3 diffusion step is then performed to simultaneously create the cathode emitter and the anode shorts in one single step.

Figure 8:
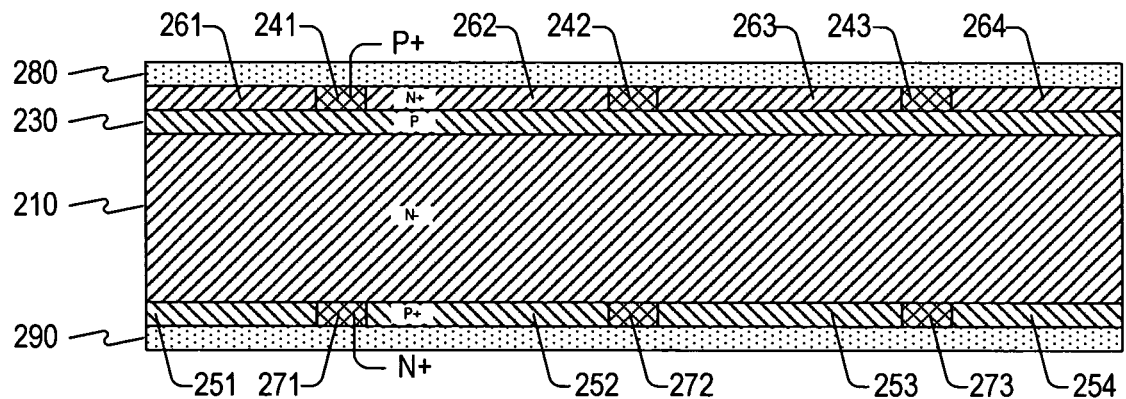
FIG. 8 is a cross-sectional view of a break over diode after the metal contacts steps of an illustrative fabrication process.
Figure 9:
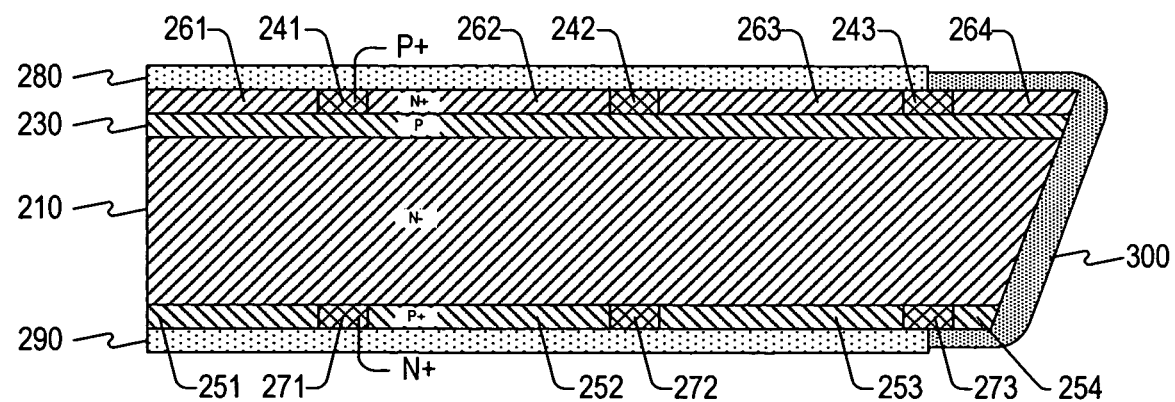
FIG. 9 is a cross-sectional view of a break over diode after the bevel, etch and passivate steps of an illustrative fabrication process.

Anode and cathode metallization steps are performed to create aluminum cathode and anode electrodes 280 and 290 of 25 micron thickness (FIG. 8). Suitable metallization processes are well known in the art.

Suitable steps are performed to create edge bevels that are covered with a passivation layer 300. Suitable beveling processes are well known in the art.

The description of the invention including its applications and advantages as set forth herein is illustrative and is not intended to limit the scope of the invention, which is set forth in the claims. Variations and modifications of the embodiments disclosed herein are possible, and practical alternatives to and equivalents of the various elements of the embodiments would be understood to those of ordinary skill in the art upon study of this patent document. Moreover, unless otherwise stated the various values and geometries are approximations, as would be appreciated by one of ordinary skill in the art. With respect to the diffusion layers, for example, while they are shown in the figures as being level and parallel to one another, in fact the diffusions may not form perfectly level and distinct abrupt junctions, but instead the junctions are more like a gradient. These and other variations and modifications of the embodiments disclosed herein, including of the alternatives and equivalents of the various elements of the embodiments, may be made without departing from the scope and spirit of the invention.

The invention claimed is:

1. A two-terminal semiconductor switching device comprising:
   a P+ layer of semiconductor material having essentially parallel first and second major surfaces;
   a plurality of N+ regions distributed in the P+ layer and passing through the P+ layer between the first and second major surfaces thereof;
   a metallization layer disposed on the first surface of the P+ layer and on a surface portion of each of the N+ regions;
   a N− layer of semiconductor material having essentially parallel first and second major surfaces, the first major surface of the N− layer being disposed proximate the second major surface of the P+ layer;
   a P layer of semiconductor material having essentially parallel first and second major surfaces, the first major surface of the P layer being disposed contiguous to the second major surface of the N− layer to form a blocking junction; a N+ layer of semiconductor material having essentially parallel first and second major surfaces, the first major surface of the N+ layer being disposed proximate the second major surface of the P layer;
   a plurality of P+ regions distributed in the N+ layer and passing through the N+ layer between the first and second major surfaces thereof;
   a metallization layer disposed on the second surface of the N+ layer and on a surface portion of each of the P+ regions; and
   a N layer of semiconductor material disposed between the P+ layer and the N− layer for providing a field stop.

2. A two-terminal semiconductor switching device electrically equivalent to an anode PNP transistor interconnected with a cathode NPN transistor, comprising:
   a first layer for operating as an anode electrode;
   a second layer of P type semiconductor material successive to the first layer for operating as an emitter of the anode PNP transistor;
   a third layer of N type semiconductor material successive to the second layer for operating as a base of the anode PNP transistor and as a collector of the cathode NPN transistor;
   a fourth layer of P type semiconductor material successive to the third layer for operating as a collector of the anode PNP transistor and as a base of the cathode NPN transistor, a blocking junction being formed between the third and fourth layers;
   a fifth layer of N type semiconductor material successive to the fourth layer for operating as an emitter of the cathode NPN transistor; and
   a sixth layer successive to the fifth layer for operating as a cathode electrode;
   wherein the second layer comprises a plurality of evenly spaced-apart N+ regions for operating as electrical shorts between the first layer and the third layer;
   wherein the fifth layer comprises a plurality of evenly spaced-apart P+ regions for operating as electrical shorts between the fourth layer and the sixth layer;
   wherein the fourth layer is thin for improving device switching speed from full blocking to full conduction; and
   wherein the fourth layer is about 20 μm thick and has a peak carrier concentration of less than about $10^{17}$ cm$^{-3}$.

3. A two-terminal semiconductor switching device electrically equivalent to an anode PNP transistor interconnected with a cathode NPN transistor, comprising:
   a first layer for operating as an anode electrode;
   a second layer of P type semiconductor material successive to the first layer for operating as an emitter of the anode PNP transistor;
   a third layer of N type semiconductor material successive to the second layer for operating as a base of the anode PNP transistor and as a collector of the cathode NPN transistor;
   a fourth layer of P type semiconductor material successive to the third layer for operating as a collector of the anode PNP transistor and as a base of the cathode NPN transistor, a blocking junction being formed between the third and fourth layers;
   a fifth layer of N type semiconductor material successive to the fourth layer for operating as an emitter of the cathode NPN transistor;
   a sixth layer successive to the fifth layer for operating as a cathode electrode; and
   a seventh layer of N type semiconductor material disposed within the third layer proximate the second layer for operating as a field stop;
   wherein the second layer comprises a plurality of evenly spaced-apart N+ regions for operating as electrical shorts between the first layer and the third layer; and
   wherein the fifth layer comprises a plurality of evenly spaced-apart P+ regions for operating as electrical shorts between the fourth layer and the sixth layer.

4. A method of fabricating a semiconductor switching device on a substrate initially of N type semiconductor material, comprising:
   forming a P type base layer in the substrate along a first surface thereof, the P type base layer forming a blocking junction with N type semiconductor material of the substrate;
   forming a plurality of P type cathode shorts extending into the P type base layer from the first substrate surface;

forming a P type anode emitter layer in the substrate along a second surface thereof, parallel to the first substrate surface;

forming a N type cathode emitter layer in the P type base layer along the first substrate surface, the P type cathode shorts being distributed throughout the N type cathode emitter layer;

forming a plurality of N type anode shorts distributed throughout the P type anode emitter layer;

forming a cathode metallization layer on the N type cathode emitter layer and on the P type cathode shorts along the first substrate surface; and forming an anode metallization layer on the P type anode emitter layer and on the N type anode shorts along the second substrate surface.

5. The method of claim 4 wherein:

the substrate is provided by a silicon wafer initially of N type and having a first wafer surface and a second wafer surface, the first and second wafer surfaces being generally planar, and the first wafer surface being parallel to the second wafer surface;

the P type base layer forming step comprises:
    patterning the first wafer surface with a base layer pattern; and
    introducing boron into the wafer through the base layer pattern;

the P type cathode shorts forming step and the P type anode emitter layer forming step are performed by:
    patterning the first wafer surface over the P type base layer with a cathode shorts pattern;
    patterning the second wafer surface with an anode emitter layer pattern; and
    introducing boron into the wafer through the cathode shorts pattern and the anode emitter layer pattern; and the N type cathode emitter layer forming step and the N type anode shorts forming step are performed by:
    patterning the first wafer surface over the P type base layer with a cathode emitter layer pattern;
    patterning the second wafer surface over the P type anode emitter layer with an anode shorts pattern; and
    introducing phosphorus into the wafer through the cathode emitter layer pattern and the anode shorts pattern.

6. The method of claim 4 wherein:

the P type cathode shorts forming step comprises forming the P type cathode shorts in an evenly spaced apart distribution throughout the N type cathode emitter layer; and the N type anode shorts forming step comprises forming the N type anode shorts in an evenly spaced apart distribution throughout the P type anode emitter layer.

7. The method of claim 4 wherein:

the P type cathode shorts forming step comprises forming the P type cathode shorts with a generally circular cross-section and in an evenly spaced apart distribution throughout the N type cathode emitter layer; and the N type anode shorts forming step comprises forming the N type anode shorts with a generally circular cross-section and in an evenly spaced apart distribution throughout the P type anode emitter layer, directly aligned with the P type cathode shorts.

8. The method of claim 4 wherein:

the P type cathode shorts forming step comprises forming the P type cathode shorts so as to occupy between eight percent and twelve percent of the N type cathode emitter layer; and the N type anode shorts forming step comprises forming the N type anode shorts so as to occupy between eight percent and twelve percent of the P type anode emitter layer.

9. The method of claim 4 wherein:

the P type cathode shorts forming step comprises forming the P type cathode shorts in an evenly spaced apart distribution throughout the N type cathode emitter layer and so as to occupy between eight percent and twelve percent of the N type cathode emitter layer; and the N type anode shorts forming step comprises forming the N type anode shorts in an evenly spaced apart distribution throughout the P type anode emitter layer and so as to occupy between eight percent and twelve percent of the P type anode emitter layer.

10. The method of claim 4 wherein the P type base layer is about 20 µm thick and has a peak carrier concentration of less than about $10^{17}$ cm$^{-3}$.

* * * * *